United States Patent

Akiyama

[11] Patent Number: 5,936,290
[45] Date of Patent: *Aug. 10, 1999

[54] SEMICONDUCTOR DEVICE HAVING AN INSULATED GATE FIELD EFFECT TRANSISTOR AND A WELL SPACED FROM THE CHANNEL REGION OF THE INSULATED GATE FIELD EFFECT TRANSISTOR

[75] Inventor: Hiroaki Akiyama, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/940,763

[22] Filed: Sep. 30, 1997

[30] Foreign Application Priority Data

Sep. 30, 1996 [JP] Japan .................................. 8-257251

[51] Int. Cl.$^6$ .......................... H01L 29/76; H01L 31/113
[52] U.S. Cl. .......................... 257/401; 257/339; 257/369; 257/372
[58] Field of Search ............................... 257/69, 240, 338, 257/339, 369, 371, 402, 401, 351, 372

[56] References Cited

U.S. PATENT DOCUMENTS

| | | | |
|---|---|---|---|
| 3,340,598 | 9/1967 | Hatcher | 257/369 |
| 5,220,191 | 6/1993 | Matsushita | 257/499 |
| 5,365,110 | 11/1994 | Matsuoka | 257/762 |
| 5,373,476 | 12/1994 | Jeon | 365/226 |
| 5,576,570 | 11/1996 | Ohsawa et al. | 257/369 |

*Primary Examiner*—Valencia Martin-Wallace
*Assistant Examiner*—George C. Eckert, II

[57] ABSTRACT

A CMOS semiconductor device comprises a well and a MOSFET adjacent to the well, wherein the distance between the channel region of the MOSFET is larger than the distance between the well and any of the source and drain of the MOSFET. The larger distance between the channel region and the well provides less fluctuation of the threshold voltage of the MOSFET.

7 Claims, 6 Drawing Sheets

SEMICONDUCTOR DEVICE HAVING AN INSULATED GATE FIELD EFFECT TRANSISTOR AND A WELL SPACED FROM THE CHANNEL REGION OF THE INSULATED GATE FIELD EFFECT TRANSISTOR

BACKGROUND OF THE INVENTION (a) Field of the Invention

The present invention relates to a semiconductor device and, more particularly, to an insulated gate field effect transistor (IGFET) such as MOSFET.

(b) Description of the Related Art

Fabrication of a small sized and high density semiconductor device is now aggressively in progress, and highly integrated devices such as memory or logic devices with a design rule of 0.15 μm~0.25 μm are being developed. As a result of very large scale integration of semiconductor devices, the dimensional reduction of the width of the gate electrode or diffused region and the reduction of the film thickness of semiconductor device have become more important.

Such semiconductor devices are fabricated by using a complementary MOS transistor (CMOS) as a base component. As a result, wells are provided on the surface area of the semiconductor substrate. For example, p-channel MOS transistor is fabricated in an n-well (region) and an n-channel MOS transistor is fabricated on a p-well (region).

For a higher integration of the semiconductor device, the reduction of a distance between a diffused region for a source or drain and a diffused region for a well is also important.

A conventional technique is described hereafter for the arrangement of the source/drain diffused region and a diffused region for the well.

FIG. 1A is a circuit diagram of a CMOS inverter, shown for an exemplary purpose, FIG. 1 is a top plan view of the CMOS inverter of FIG. 1A, and FIG. 2 is a cross-sectional view taken along line A-A' in FIG. 1B.

In FIG. 1A, the gate of a p-channel MOS transistor Q1 and the gate of an n-channel MOS transistor Q2 are connected together to an input IN. The drains of transistors Q1 and Q2 are also connected together to an output OUT. The source of the p-channel MOS transistor Q1 is connected to a power source line Vdd and the source of the n-channel MOS transistor Q2 is connected to the ground line Vss.

In FIGS. 1B and 2, an n-well 102 is formed on a silicon substrate 101, and a p-type diffused region 103 for the source and a p-type diffused region 104 for the drain of the p-channel NOS transistor Q1 are formed within the n-well 102. A diffused region 105 for the n-well contact is formed in the n-well 102. The p-type source region 103 and the n-well contact region 105 are connected together to Vdd line 106 through the openings provided therefor.

Similarly, an n-type drain region 107, an n-type source region 108 and a substrate contact region 109 are disposed on the surface area of the silicon substrate 101. The n-type diffused region 108 and the substrate contact region 109 are connected together to Vss line 110 through the openings provided therefor.

A common gate electrode 111 is formed for both the p-channel MOS transistor Q1 and the n-channel MOS transistor Q2 and connected to the input IN. Both the p-type drain region 104 of the p-channel MOS transistor Q1 and the n-type drain region 107 of the n-channel MOS transistor Q2 are connected together to the output line 112 through the openings provided therefor. The n-well 102 has a depth of about 4 μm~8 μm, for example. The p-type source region 103 of the p-channel MOS transistor Q1, the p-type drain region 104 thereof and the well contact region 105 are disposed within the n-well region 102. Here, these diffused regions contain a heavy density of boron as an impurity element. Also, the n-type drain region 107 of the n-channel MOS transistor Q2, the n-type source region 108 and the substrate contact region 109 are formed on the surface area of the silicon substrate 101. Field oxide films 113 and 113a are selectively provided on the surface area for the separation of the transistors.

A gate oxide film 114 and a gate electrode 115 are formed for the p-channel MOS transistor Q1. Similarly, a gate oxide film 116 and a gate electrode 117 are formed for the n-channel MOS transistor Q2. Both the gate electrodes 115 and 117 are connected together to the input IN.

An interlayer dielectric film 118 is formed on the gate electrodes 115 and 117, Vdd line 106 is formed for connecting together the p-type source region 103 and the well-contact region 105. Similarly, the Vss line 110 is formed for connecting together the n-type source region 108 and the substrate-contact region 109. Both the p-type drain region 104 and the n-type drain region 107 are connected together to the output line 112.

In the conventional semiconductor device as described above, it is generally known that a small isolation distance between diffused regions involves a parasitic bipolar transistor formed in the CMOS structure which sometime causes a latch-up failure. Moreover, the small isolation distance involves a low withstand voltage due to punch-through between the source/drain region of the MOS transistor formed within the well and the silicon substrate.

Patent Publication No.JP-A-58(1983)-201358 shows a solution for the problem latch-up by forming a heavily doped n-type diffused region on the bottom part of an n-well.

Patent Publication No.JP-A-61(1986)-7033 shows a solution for the problem punch-through and the resultant lowering of the with stand voltage by making a distance between heavily diffused regions of the same conductivity type within a well larger than the distance between other regions.

In order for fabrication of a highly integrated CMOS semiconductor, a distance $X_1$ between the n-well 102 and the n-type drain region 108, and a distance $Y_1$ between the n-well 102 and the n-type source region 107 shown in FIGS. 1B and 2 should be reduced as much as possible.

In the conventional technique, the lower limit of $X_1$ or $Y_1$ is determined based on the withstand voltage between the n-well 102 and the n-type diffused region 107 or 108, as a result of which $X_1$ and $Y_1$ are determined as an equal value.

In the conventional device as discussed above, the absolute threshold voltage (Vt) of a MOS transistor is slightly lowered in a region adjacent to the well on the silicon substrate, if the lower limit is actually applied to the CMOS transistor. Specifically, a positive threshold voltage of an n-channel MOS transistor disposed most adjacent to an n-well is about 40 mV lowered from a normal threshold voltage, for example, 0.8 volt. Similarly, a negative threshold voltage of a p-channel MOS transistor disposed most adjacent to the p-well is about 50 mV raised from a normal threshold voltage, for example, −1.0 volt. Such a phenomenon of the threshold voltage fluctuation was confirmed by the inventor.

Such a small threshold voltage fluctuation is not critical for semiconductor devices of current technique. However,
} the small fluctuation will cause a significant problem when the gate width of a MOS transistor is made smaller due to the miniaturization of semiconductor devices, or the operating voltage for the MOS transistor is lowered in the semiconductor devices. Particularly, it will cause a critical problem in an integrated-circuit such as DRAM comprising a sense amplifier for amplifying a fine voltage.

SUMMARY OF THE INVENTION

It is, therefore, an object of the present invention to prevent the fluctuation of a threshold voltage of the MOS transistor disposed adjacent to the well as discussed above, and provide a highly integrated semiconductor device of an excellent characteristics.

In short, according to the present invention, a semiconductor device is provided wherein a distance between the well and the channel region of the MOS transistor is determined to be larger than a distance between the well and the source/drain diffused regions of the MOS transistor.

By the configuration as described above, a fluctuation of an absolute threshold votage of the MOS transistor disposed adjacent to the well formed on the semiconductor substrate can be suppressed.

The above and other objects, features and advantages of the present invention will be more apparent from the following description, referring to the accompanying drawings.

PREFERRED EMBODIMENTS OF THE INVENTION

Figure 1A:
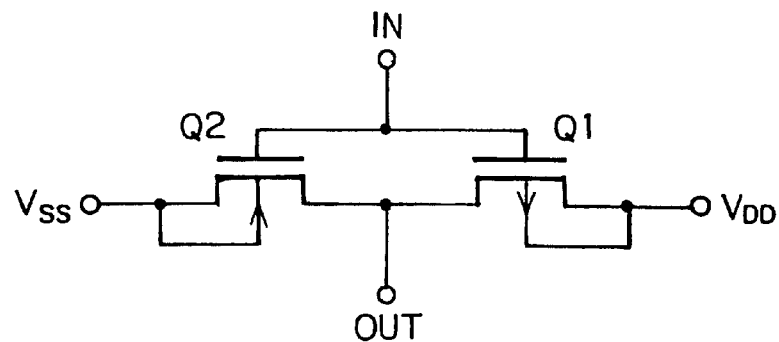
FIG. 1A is a circuit diagram of a conventional CMOS semiconductor device.
Figure 1B:
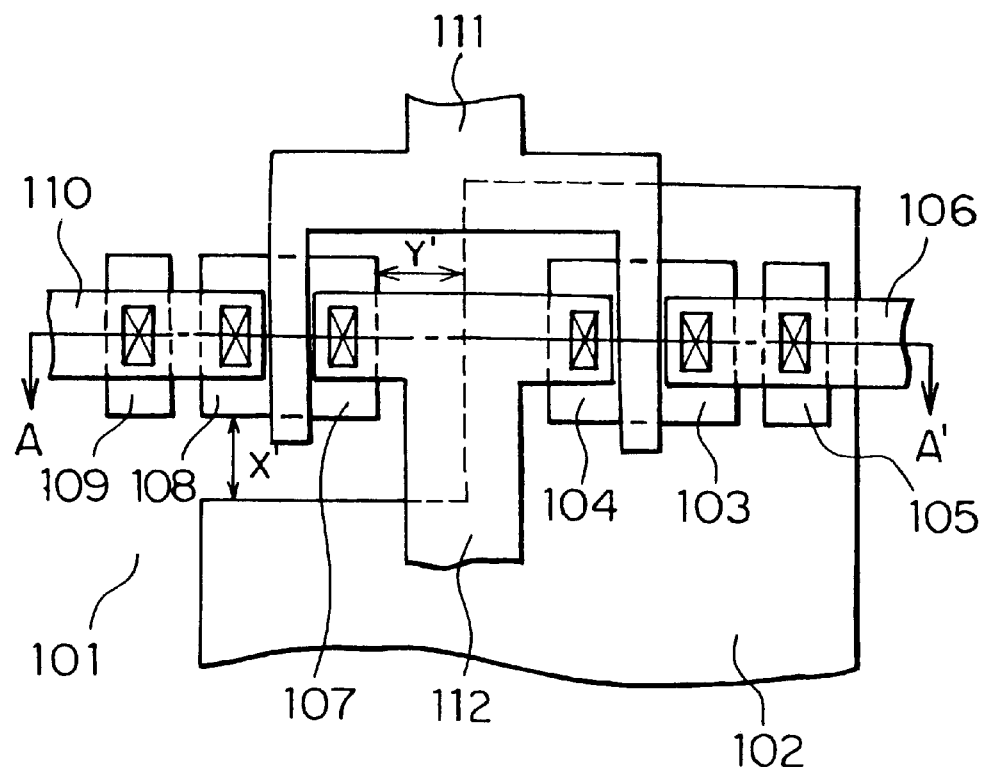
FIG. 1B is a top plan view of the CMOS semiconductor device of FIG. 1A.
Figure 2:
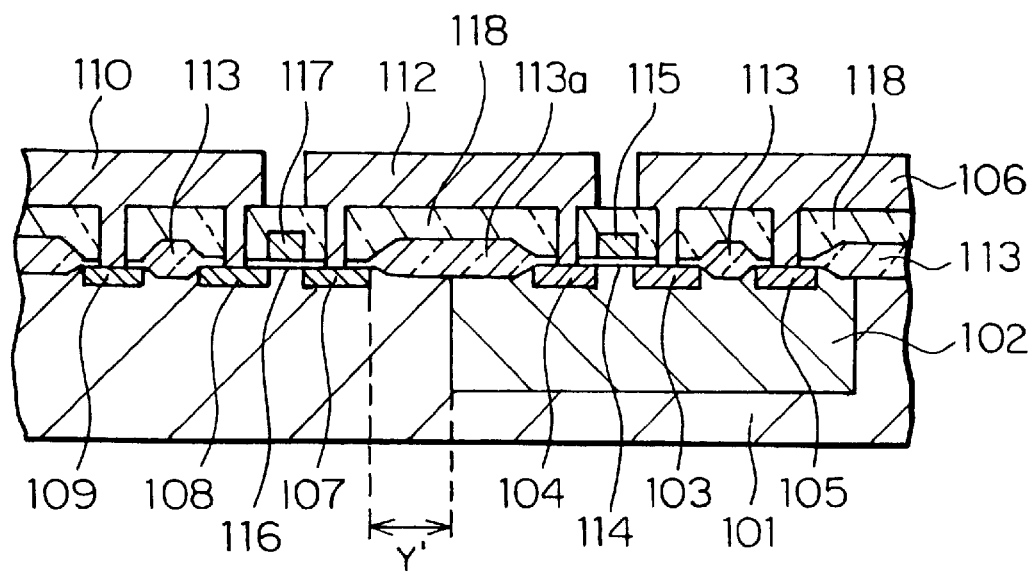
FIG. 2 is a cross-sectional view taken along line A-A' in FIG. 1B.

Now, the present invention is more specifically described with reference to the accompanying drawings, wherein similar constituent elements are designated by the same or similar reference numerals.

Figure 3:
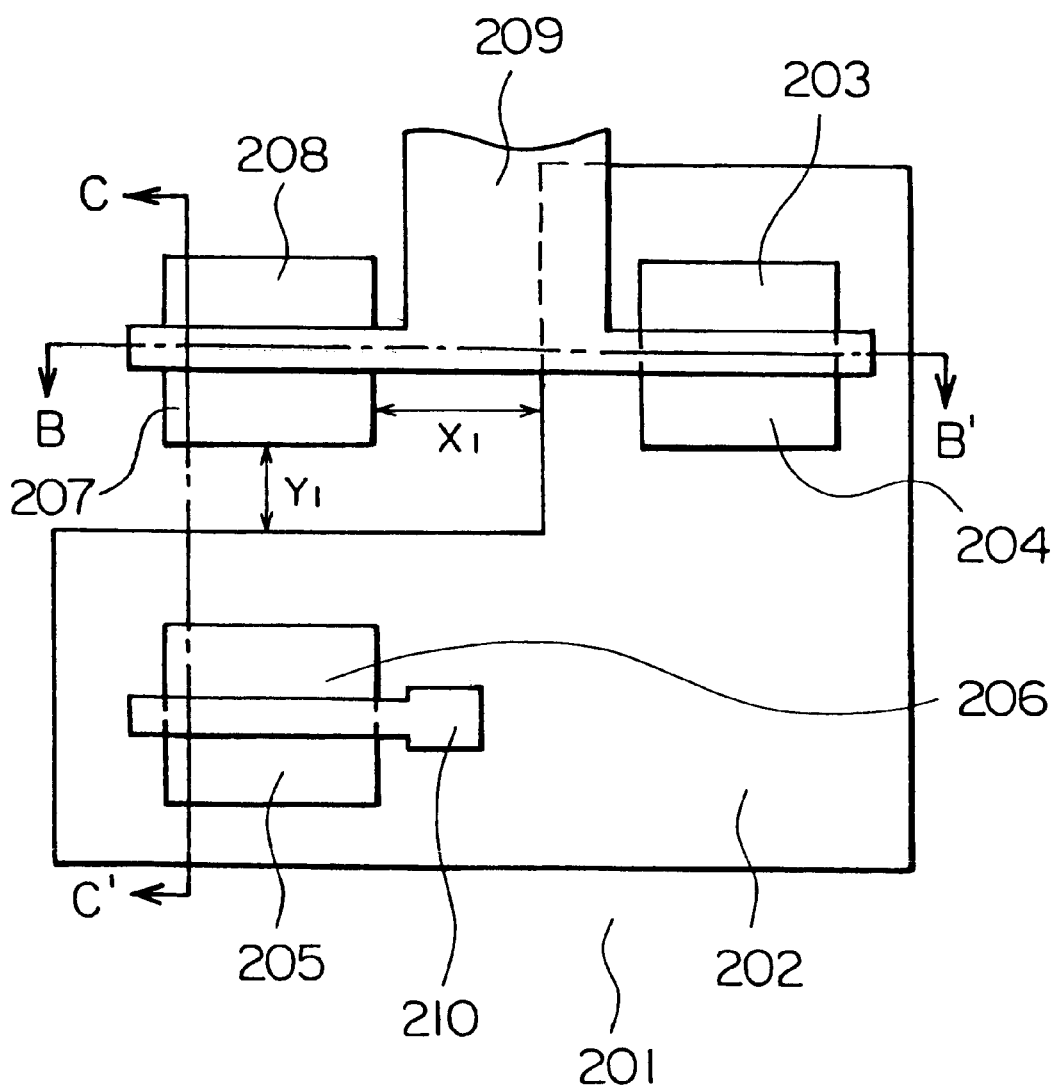
FIG. 3 is a top plan view of a semiconductor device according to a first embodiment of the present invention.
Figure 4A:
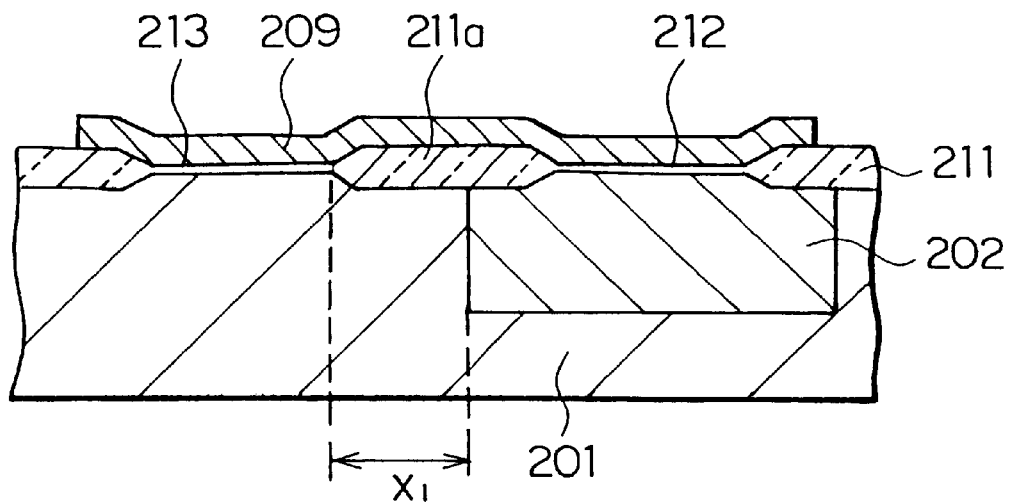
FIGS. 4A is a cross-sectional view taken along line B-B' in FIG. 3.
Figure 4B:
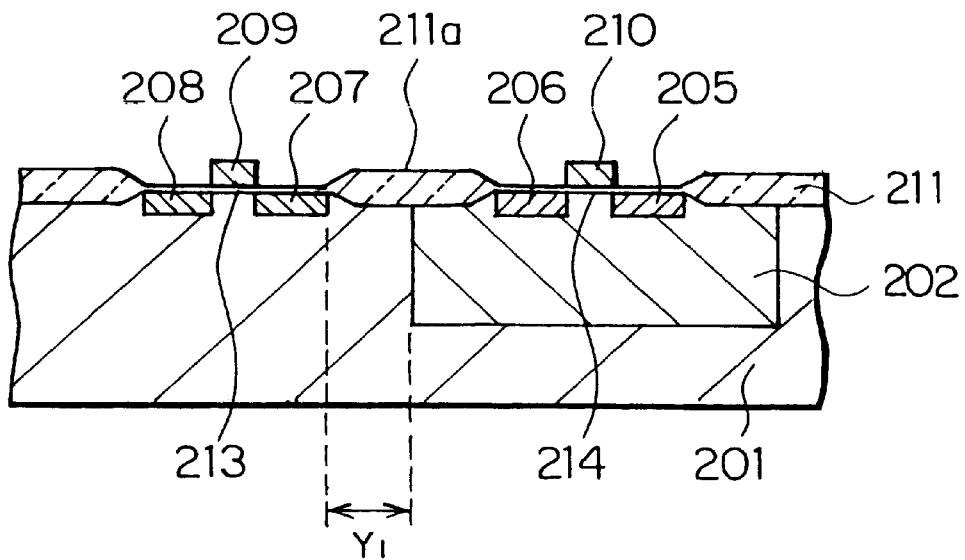
FIG. 4B is a cross-sectional view taken along line C-C' in FIG. 3.

Referring to FIGS. 3, 4A and 4B, an n-well 202 is formed on a surface area of a p-type silicon substrate 201. Heavily doped p-type source/drain regions 203 and 204 of a first p-channel MOS transistor (MOSFET) are formed within the n-well 202. Similarly, heavily doped p-type source/drain regions 205 and 206 of a second p-channel MOS transistor are formed in the n-well 202.

On another surface area of the p-type silicon substrate 201, heavily doped n-type source/drain regions 207 and 208 are formed for an n-channel MOS transistor.

A common gate 209 is formed for both the first p-channel MOS transistor and the n-channel MOS transistor. The gate 210 of the second p-channel MOS transistor is formed above the n-well 202.

In FIG. 3, the space between the n-well 202 and the n-type drain region 207 is denoted by $X_1$ in the direction normal to the channel of the n-channel MOS transistor. The distance between the n-well 202 and the n-type drain region 207 is denoted by $Y_1$ in the direction of the channel of the n-channel MOS transistor. The lower limit of the distance $Y_1$ is determined by the withstand voltage between the n-well 202 and the n-type drain region 207. The distance $X_1$ between the diffused regions 208 and 202 are determined to be larger than the distance $Y_1$.

The p-type substrate 201 has an impurity concentration of about $10^{16}$ atoms/cm$^3$. The depth of the n-well region 202 is 4 $\mu$m. The n-well region 202 is formed by a known process including doping of phosphorus ions and a subsequent heat treatment. The impurity concentration of the n-well 202 is determined at about $10^{17}$ atoms/cm$^3$.

Field oxide films 211 and 211a are selectively formed on the silicon substrate 201 for isolation. A gate oxide film 212 of the first p-channel MOS transistor is formed on the n-well 202. Similarly, a gate oxide film 213 of the first n-channel MOS transistor is formed on the silicon substrate 201. Also, a common gate electrode 209 is formed to overlay the gate oxide film 212 of the first p-channel MOS transistor 212 and the gate oxide film 213 of the n-channel MOS transistor.

As described before, $X_1$ represents the distance between the n-well 202 disposed below the isolation region 211a and the gate oxide film 213 of the n-channel MOS transistor. The p-type source region 205 and the p-type drain region 206 are formed as heavily doped regions containing boron ions. The n-type drain region 207 and the n-type source region 208 of the n-channel MOS transistor are formed as heavily doped regions containing arsenic ions.

A gate oxide film 214 and the overlaying gate electrode 209 are formed for the second p-channel transistor. The gate oxide film 213 and the overlaying gate electrode 209 are formed for the n-channel transistor.

In FIG. 4B, $Y_1$ represents the distance between the n-well 202 disposed below the isolation region 211a and the n-type drain region 207 of the n-channel MOS transistor. In the present invention, the distance $X_1$ is determined larger than the distance $Y_1$.

Figure 5:
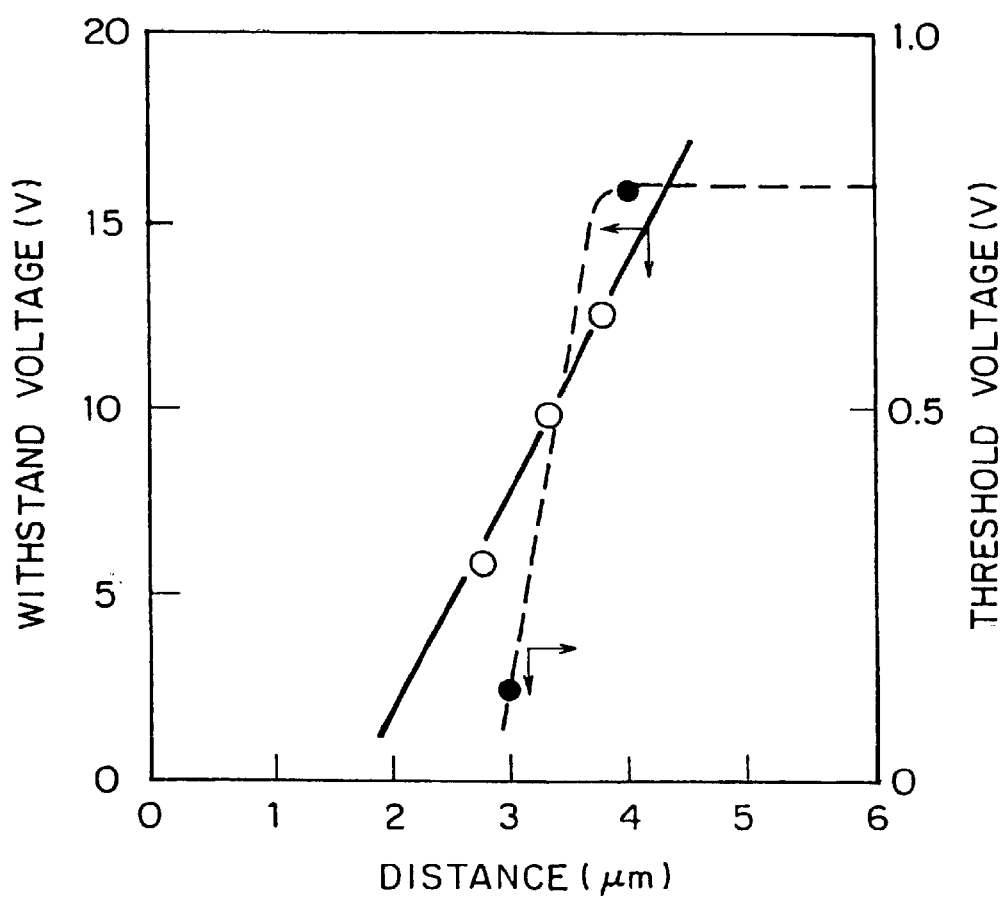
FIG. 5 is a graph showing a distance dependence of the withstand voltage and the threshold voltage of CMOS transistors; and, FIG. 6 is a partial top plan view of a semiconductor device according to a second embodiment of the present invention.

Referring to FIG. 5 showing a distance dependence of the withstand voltage between the diffused regions and the threshold voltage of the CMOS transistor, the relationship between the distances $X_1$ and $Y_1$ can be understood. In the graph, abscissa is plotted for the smallest design distance between the n-well region and the n$^+$-type source/drain region of the n-channel MOS transistor disposed most adjacent to the n-well. Ordinate plotted on the left side for the solid graph shows withstand voltages of a part of the p-type silicon substrate sandwitched between the n-well region and the n$^+$ region. Ordinate plotted on the right side for the dotted line shows threshold voltage of the n-channel MOS transistor. In the present embodiment, the impurity concentration of the p-type silicon substrate is determined at $10^{16}$ atoms/cm$^3$, and the impurity concentration of the n-well is determined at $10^{17}$ atoms/cm$^3$. In the actual device, the well was about 4 $\mu$m-deep, and about 3 $\mu$m-wide. The measurement of withstand voltage at the interface was effected similarly to the case of a circuit function test. Specifically, a positive voltage is applied to the n-well, with the silicon substrate and n$^+$ region being grounded.

The solid line in the FIG. 5 shows that the withstand voltage between the n-well and n$^+$ diffused region linearly increases with the increase of the designed distance. The dotted line shows, on the other hand, that the threshold voltage of an n-channel MOS transistor saturates at a certain voltage and the threshold voltage suddenly drops below the threshold voltage as the distance decreases.

As will be understood from the graph, if the distance between the n-well and the n⁺ region becomes smaller, the threshold voltage of the MOS transistor fluctuates prior to the rapid drop of the withstand voltage. Moreover, the threshold of the MOS transistor falls rapidly with a small change in the distance between the n-well and the n⁺ region. These characteristics show that the distance $X_1$ should be set larger than $Y_1$, i.e. the lower limit of the distance should be determined based on $X_1$. On the other hand, in the conventional method, the diffused region was determined based on the distance $Y_1$.

Such characteristics become much clearer if the semiconductor device has a smaller size or a lower operating voltage. The locational relationship between the well and a MOS transistor provides critical effects, particularly, an integrated-circuit such as a DRAM comprising a sense amplifier for amplifying a fine voltage.

Figure 6:
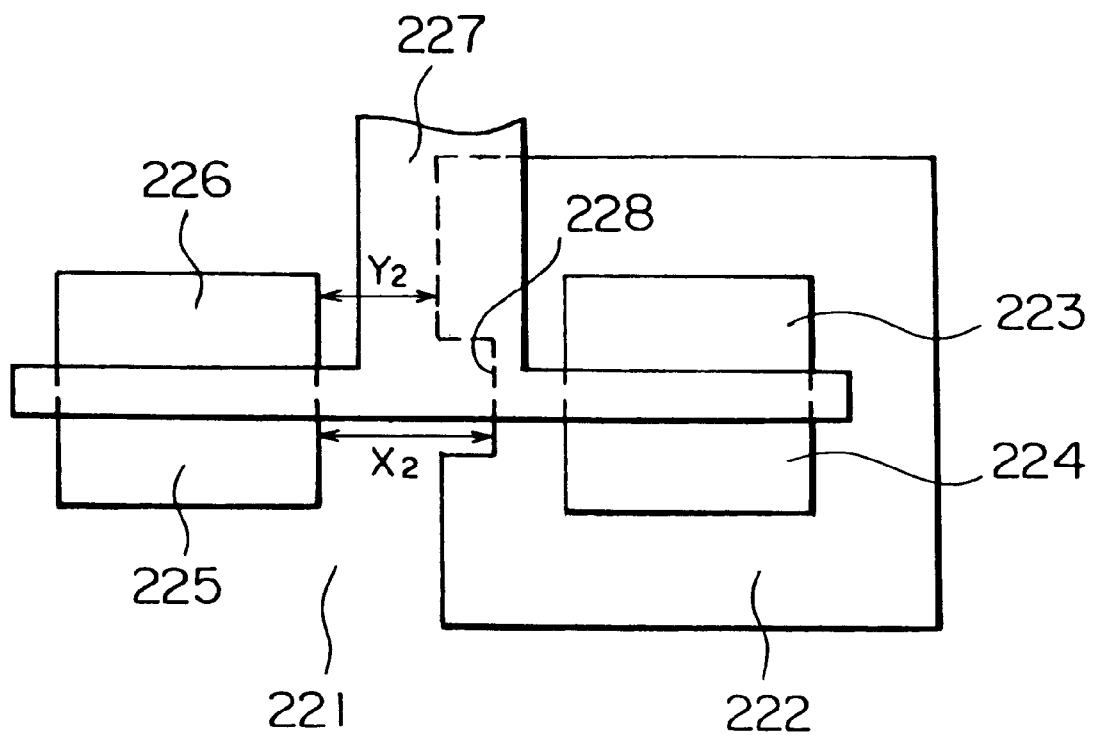

Referring to FIG. 6, a semiconductor device according to a second embodiment of the present invention comprises a CMOS circuit formed on a silicon substrate. For simplification of description, only each of diffused regions and gate electrode of the MOS transistor are illustrated.

In FIG. 6, an n-well 222 is formed on a designated region of a silicon substrate 221. A heavily doped p-type source region 223 of a p-channel MOS transistor and a heavily doped a p-type drain region 224 are formed within the n-well 222.

A heavily doped n-type drain region 225 and a heavily doped n-type source region 226 of an n-channel MOS transistor are formed on the p-type silicon sustrate. A common gate electrode 227 is formed for both the p-channel MOS transistor and the n-channel MOS transistor.

In FIG. 6, $X_2$ denotes the distance between the n-well 222 and the channel region 225 of the n-channel MOS transistor in the direction normal to the channel of the n-channel MOS transistor. $Y_2$ denotes the distance between the n-well 222 and the heavily doped n-type drain region 226 or 225 in the same direction. The distance $X_2$ is determined larger than the distance $Y_2$ by providing an indent edge 228 of the n-well 222 adjacent to the channel region of the n-channel MOS transistor, as shown in FIG. 6.

In the embodiments as described above, the n-well is formed on the p-type silicon substrate, the p-channel MOS transistor is formed within the n-well, and the n-channel MOS transistor is formed on the p-type silicon substrate. However, the present invention is not limited to the specific embodiments described above. For example, the present invention is applicable when a deep n-well is formed on a p-type silicon substrate and an n-channel MOS transistor and a p-well are formed within the deep n-well.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a substrate, a first well of a first conductivity type defined by borders and formed in a first surface area of said substrate, an insulated gate field effect transistor (IGFET) formed in a second surface area of said substrate outside said first surface area, said IGFET having an overlapping gate, a source, a drain and a channel region extending between said source and drain, said gate extending parallel to said channel region, wherein a shortest distance X measured parallel to said gate between a first border of said first well and said channel region, said first border facing said channel region, is larger than a distance Y measured between a second border defining said first well and one of said source and drain.

2. A semiconductor device as defined in claim 1, wherein a field oxide film is formed between an edge portion of said first surface area and an edge portion of said second surface area.

3. A semiconductor device as defined in claim 1 further comprising a second well of a second conductivity type opposite to said first conductivity type in a third surface area of said substrate other than said second surface area, wherein said first well is disposed in said second well.

4. A semiconductor device as defined in claim 1 further comprising in said first well another IGFET acting as an amplifier.

5. A semiconductor device as defined in claim 4 wherein said amplifier is a sense amplifier.

6. A semiconductor device as defined in claim 1 wherein said distance between said first well and any of said source and drain is measured in the direction parallel to said channel region.

7. A semiconductor device comprising a substrate, a first well of a first conductivity type defined by borders and formed in a first surface area of said substrate, an insulated gate field effect transistor (IGFET) formed in a second surface area of said substrate outside said first surface area, said IGFET having a gate overlapping a source, a drain and a channel region extending between said source and drain, said gate extending parallel to said channel region, wherein a distance X measured parallel to said gate between a first border of said first well and said channel region is larger than a distance Y measured between a second border defining said first well and one of said source and drain, wherein said distance Y between said first well and any of said source and drain is measured in the direction normal to said channel region, and said first well has an indent edge adjacent to said channel region.

* * * * *